(12) United States Patent
Kim (10) Patent No.: US 9,325,154 B2
(45) Date of Patent: Apr. 26, 2016

(54) WAVELENGTH-TUNABLE LASER APPARATUS HAVING WAVELENGTH MEASURING FUNCTION

(71) Applicant: Jeong Soo Kim, Chungcheongnam-do (KR)

(72) Inventor: Jeong Soo Kim, Chungcheongnam-do (KR)

(73) Assignee: PHOVEL. CO. LTD, Daejeon (KR)

( * ) Notice: Subject to any disclaimer, the term of this patent is extended or adjusted under 35 U.S.C. 154(b) by 0 days.

(21) Appl. No.: 14/372,019

(22) PCT Filed: Nov. 28, 2012

(86) PCT No.: PCT/KR2012/010190
§ 371 (c)(1),
(2) Date: Jul. 13, 2014

(87) PCT Pub. No.: WO2013/105733
PCT Pub. Date: Jul. 18, 2013

(65) Prior Publication Data
US 2015/0030042 A1    Jan. 29, 2015

(30) Foreign Application Priority Data

Jan. 13, 2012  (KR) .................. 10-2012-0004538
Feb. 29, 2012  (KR) .................. 10-2012-0020765

(51) Int. Cl.
*H01S 3/10*    (2006.01)
*H01S 5/0687*  (2006.01)
*H01S 5/022*   (2006.01)

(52) U.S. Cl.
CPC ........... *H01S 5/0687* (2013.01); *H01S 5/02292* (2013.01); *H01S 5/02212* (2013.01); *H01S 5/02248* (2013.01)

(58) Field of Classification Search
CPC ............................... H01S 3/02; H01S 3/06704
USPC ........................................................ 372/20
See application file for complete search history.

(56) References Cited

U.S. PATENT DOCUMENTS 6,144,025 A * 11/2000 Tei ............................ G01J 1/44
                                                              250/206
6,377,592 B1 * 4/2002 Auracher ............ H01S 5/02252
                                                              372/29.011

(Continued)

FOREIGN PATENT DOCUMENTS

CN    101689746 A    3/2010
JP    2003-060292 A  2/2003

(Continued)

*Primary Examiner* — Jessica Stultz
*Assistant Examiner* — Vu A Vu
(74) *Attorney, Agent, or Firm* — AKC Patents LLC (57) ABSTRACT

The present invention relates to a wavelength-tunable laser apparatus which can measure a wavelength in a wavelength-tunable laser diode package structure for dense wavelength division multiplexing (DWDM) having a transistor outline (TO) type appearance. The wavelength-tunable laser apparatus of the present invention is a TO-can type wavelength-tunable laser apparatus comprising: a laser diode chip for emitting a laser beam; a collimator lens for collimating the laser beam; a wavelength-selective filter through which the selected wavelength passes; and a reflecting mirror having an inclined reflective surface, wherein the laser beam is split into a beam which is emitted from the laser diode chip (100), collimated by the collimator lens (200) and emitted through a 45-degree reflective mirror (300) to the outside of a TO-can type package, and a beam which passes through the 45-degree reflective mirror (300), the beam passing through the 45-degree reflective mirror (300) is split into at least two branched beams, a first photodiode (510) is arranged on the path of one branched beam so as to monitor the beam, and wavelength-selective filters (400, 600) having variable transmittance according to the wavelengths and a second photodiode (520) are further arranged on the path of the other branched beam.

1 Claim, 9 Drawing Sheets

DIRECTION CHANGE OF A PART OF LASER BEAM INTO UPWARD DIRECTION

(56) References Cited

U.S. PATENT DOCUMENTS

| | | | |
|---|---|---|---|
| 7,085,448 B2* | 8/2006 | Delpiano | H01S 5/0687 372/6 |
| 7,088,441 B2* | 8/2006 | Nahum et al. | 356/222 |
| 7,710,581 B2* | 5/2010 | Harker | H01S 5/0687 356/454 |
| 2010/0226655 A1* | 9/2010 | Kim | 398/139 |
| 2011/0069387 A1* | 3/2011 | Iida | 359/484 |
| 2011/0187998 A1* | 8/2011 | Kimura et al. | 353/20 |

FOREIGN PATENT DOCUMENTS

| | | |
|---|---|---|
| JP | 2004-335532 A | 11/2004 |
| JP | 2008-304932 A | 12/2008 |
| KR | 10-0871011 B1 | 11/2008 |
| KR | 10-2011-0101016 A | 9/2011 |

* cited by examiner

DIRECTION CHANGE OF A PART OF LASER
BEAM INTO UPWARD DIRECTION

*FIG. 4 (Prior Art)*

DIRECTION CHANGE OF A PART OF
LASER BEAM INTO UPWARD DIRECTION

PATH OF LASER BEAM

Fig.11

WAVELENGTH-TUNABLE LASER APPARATUS HAVING WAVELENGTH MEASURING FUNCTION

TECHNICAL FIELD

The present invention relates to a wavelength-tunable laser apparatus and more particularly to a wavelength-tunable laser apparatus capable of measuring a wavelength in a wavelength-tunable laser diode package structure which has a transistor outline (TO) type appearance and is for dense wavelength division multiplexing (DWDM).

BACKGROUND DESCRIPTION

Recently, an optical communication is commonly used, which uses light as an information transmission medium for the purpose of high capacity information transmission and high speed information communication. Also, in these days, it is possible to easily convert a 10 giga bit per second (Gbps) electrical signal into a laser beam by using a semiconductor laser diode chip having an approximately 0.3 mm horizontal length and an approximately 0.3 mm vertical length, and to easily convert an optical signal transmitted through an optical fiber into the electrical signal by using a semiconductor light-receiving device. Light is an energy wave having very peculiar characteristics. In order that several lights existing in an area at the same time interact with one another, the interacting lights should have the same wavelength or the same phase and have the same traveling direction. Therefore, the lights have a very low degree of interference, and a wavelength division multiplexing (WDM) method is now widely used, which transmits the laser beam having various different wavelengths to one optical fiber by using the characteristics of the light. For the application of the WDM method, there is a requirement of a laser beam source capable of emitting laser beam having a wavelength fixed appropriately according to the interval between adjacent wavelengths.

At present, the interval between the wavelengths in the dense wavelength division multiplexing tends to be gradually reduced to 1.6 nm (nano meter), 0.8 nm or 0.4 nm.

Therefore, for such a wavelength division multiplexing, the wavelength width of the light source should be very small, and the wavelength of the laser beam source should be very strictly fixed with respect to the changes of various laser beam source driving environments, such as a temperature, laser driving current, etc. Wavelength precision within ¼ of the wavelength interval is generally required. Therefore, when the wavelength interval of the wavelength multiplexing is 1.6 nm, 0.8 nm or 0.4 nm, the degree of the wavelength stabilization should be precisely controlled within +/−0.2 nm, +/−0.1 nm and +/−0.05 nm.

In the dense wavelength division multiplexing communication, 32-channel wavelength and 64-channel wavelength require mutually different light sources, and thus, it has been difficult to prepare a separate light source corresponding to each wavelength. Therefore, a wavelength-tunable laser has been popular, which is able to respond to all the various channels. The wavelength-tunable laser apparatus has a structure in which the wavelength is tunable. The wavelength-tunable mechanism may cause the instability of the wavelength. As a result, a wavelength measuring method capable of measuring the wavelength of the laser beam is now widely used in the wavelength-tunable laser.

Figure 1:
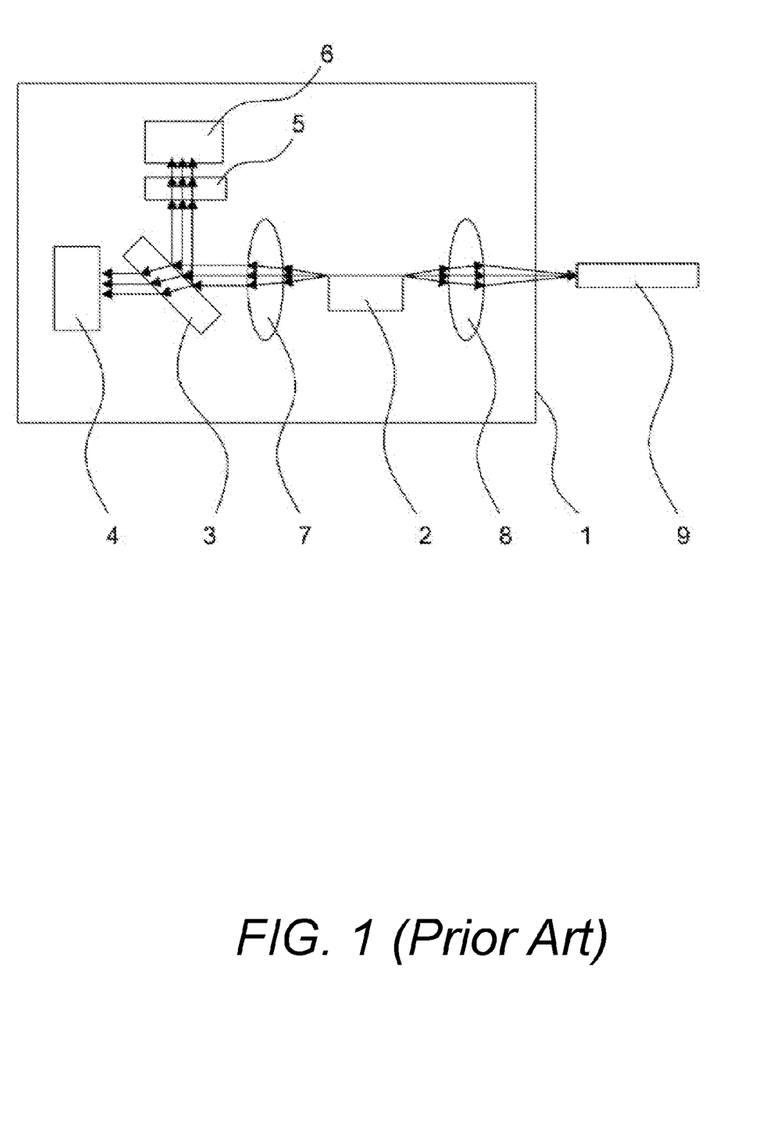
FIG. 1 is a conceptual view showing an existing butterfly type optical module package which has a wavelength monitoring function.

FIG. 1 shows an existing butterfly type laser package having a wavelength stabilization device therewithin cited in registered Korean Patent No. 10-0871011 of the present inventor. As shown in FIG. 1, in the existing butterfly type package having the wavelength measuring device in the laser diode package, the laser beam emitted from one side of a laser diode chip 2 is connected to an optical fiber 9 and is applied to the communication, and the laser beam emitted from the other side of the laser diode chip 2 is collimated and split into two branched beams. Then, a wavelength selective transmission filter having transmission characteristics which are changed according to the wavelength and a monitoring photo diode 6 for monitoring the intensity of the beam which has transmitted through the wavelength selective filter 5 are disposed on the path of one beam. A photo diode 4 for detecting the intensity of the beam emitted from the laser diode chip 2 is disposed on the path of the other beam. The transmittance in which the laser beam transmits through the wavelength selective filter 5 is computed by comparing current flowing through the two disposed photo diodes 6 and 4, and wavelength information of the laser beam is obtained through the transmittance. Therefore, in the existing butterfly type laser package having the wavelength stabilization device therewithin cited in the patent, the optical communication is performed by using the laser beam emitted from the one side of the laser diode chip, and the light power and wavelength of the laser are obtained by using the laser beam emitted from the other side of the laser diode chip.

Figure 2:
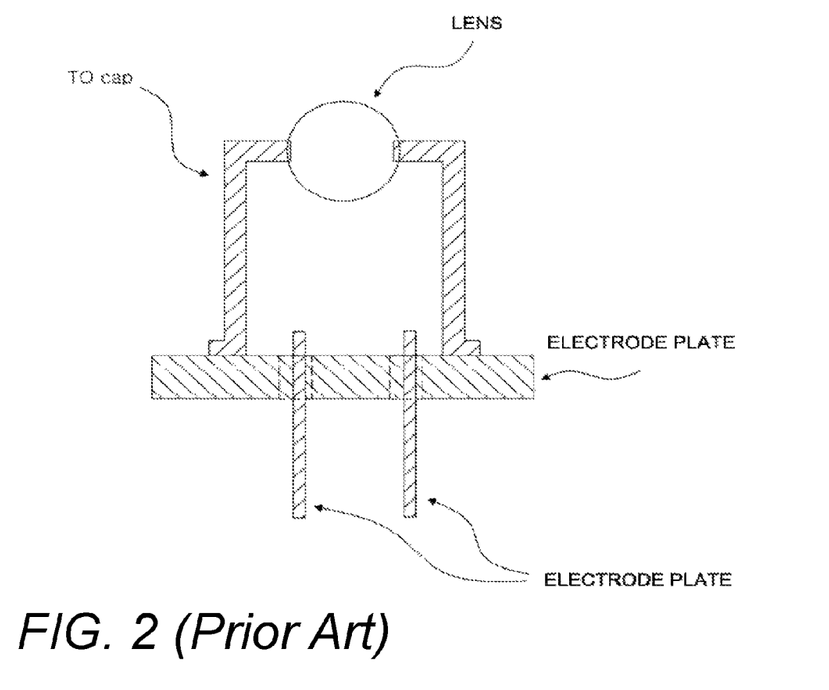
FIG. 2 is a conceptual view of a package housing of an existing TO can type optical module.

FIG. 2 shows a general TO can type package for optical communication. In general, the TO can type package has a much lower manufacturing cost and a smaller volume than those of the butterfly type package, and thus, is widely used in the optical module for communication. However, in the TO can type package, since a stem bottom surface on the optical parts are placed is perpendicular to the light beam output direction, it is required that the direction of the beam which is disposed on the stem bottom surface and is emitted in parallel with the stem bottom surface should be changed into a perpendicular direction by using a 45-degree reflection mirror. However, the current optical communication requires that the volume of the optical module is minimized and many optical modules for subscribers are installed in a telephone station having a limited area. Thus, in order to minimize the volume of the wavelength-tunable laser including a wavelength measuring device and to reduce the cost of the wavelength-tunable laser, there is a requirement for a method for mounting a wavelength-tunable laser module including the wavelength measuring device on the TO can type package.

Figure 3:
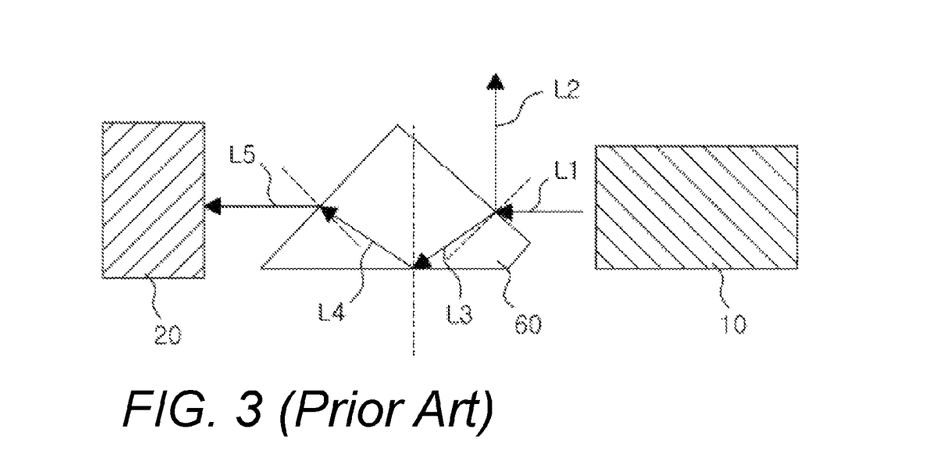
FIG. 3 is a conceptual view of the existing TO can type optical module which has a front monitoring function.

FIG. 3 shows a TO can type package module having a front optical monitoring function disclosed in the Korean Patent No. 10-09136251 registered by the present inventor. As described in the patent, the TO can type package module having the front optical monitoring function shown in FIG. 3 can be applied when the intensities of the laser beams emitted from the one and the other sides of the laser diode chip achieve a constant ratio. It is indicated that, in the laser diode chip of which one side has a reflectance less than 0.1% like a reflective semiconductor optical amplifier (RSOA), since the intensities of the beam emitted to both sides of the laser diode chip are changed depending on the current flowing through the laser diode chip, the optical monitoring at the rear side of the laser diode chip does not reflect the intensity of the laser beam emitted from the front side of the laser diode chip. Therefore, the patent discloses a method for directly monitoring the beam emitted from the front side of the laser diode chip by transmitting a part of the beam emitted from the front side of the laser diode chip (toward the optical fiber) through the 45-degree reflection mirror.

Figure 4:
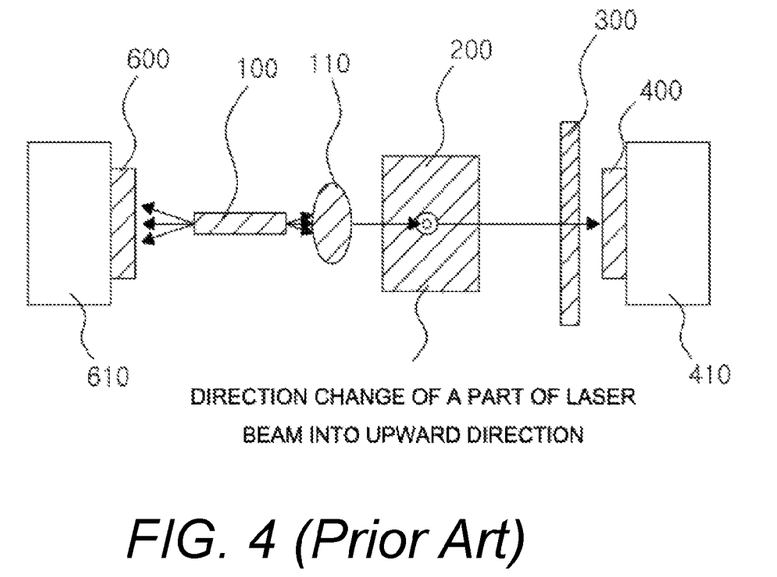
FIG. 4 is a conceptual view of the existing TO can type optical module which has the wavelength monitoring function.

Meanwhile, FIG. 4 shows a method for obtaining the intensity and wavelength information of the laser beam by using the laser beam emitted to the front and rear sides of the laser diode chip in the TO can type package in the Korean Patent No. 10-0871011 registered by the present inventor. However, as described in the Korean Patent No. 10-0913625 registered by the present inventor, the method can be applied to distributed feedback laser diode (DFB-LD) chip and is difficult to apply to the RSOA.

Therefore, like the RSOA used in the wavelength-tunable laser, in the laser diode chip having a very big reflectance difference, for example, one side of the laser diode chip has a reflectance less than 0.1% and the other side has a reflectance greater than 10%, it is not possible to monitor the wavelength and intensity of the laser beam by using the beam emitted from both sides of the laser diode chip.

Therefore, a special means is required so as to manufacture the wavelength-tunable laser including an inexpensive wavelength measuring device for the purpose of utilization of the inexpensiveness and miniaturization of the TO can type package.

DETAILED DESCRIPTION

Technical Assignment

The embodiment of the present invention is designed to overcome the above problems. The objective of the present invention is to provide a wavelength-tunable laser apparatus capable of measuring the wavelength by installing a wavelength measuring device in the TO can type package included in the wavelength-tunable laser.

Technical Solution

The objective of the present invention is to provide a wavelength-tunable laser apparatus which is a TO-can type wavelength-tunable laser apparatus including a laser diode chip for emitting a laser beam, a collimator lens for collimating the laser beam, a wavelength-selective filter through which the selected wavelength passes, and a reflecting mirror having an inclined reflective surface. The laser beam is split into a beam which is emitted from the laser diode chip, collimated by the collimator lens and emitted through a 45-degree reflective mirror to the outside of a TO-can type package, and a beam which passes through the 45-degree reflective mirror, the beam passing through the 45-degree reflective mirror is split into at least two branched beams, a first photodiode is arranged on the path of one branched beam so as to monitor the beam, and wavelength-selective filters having variable transmittance according to the wavelengths and a second photodiode are further arranged on the path of the other branched beam.

It is preferable that the wavelength selective filter includes a reflective surface and a substrate reflective surface. The reflective surface is formed by stacking a dielectric thin film of which transmittance/reflectance are not varied according to the wavelength on one side of the wavelength selective filter, on which the laser beam is incident, and wherein the substrate reflective surface is formed by depositing the wavelength selective filter of which the transmittance/reflectance are varied according to the wavelength on the other side of the wavelength selective filter.

Also, the wavelength selective filter may include a reflective surface and a non-reflective surface. The reflective surface is formed by stacking a thin film of which transmittance/reflectance are varied according to the wavelength on one side of the wavelength selective filter, on which the laser beam is incident. The non-reflective surface is formed on the other side of the wavelength selective filter.

Meanwhile, in the wavelength-tunable laser apparatus of the present invention, intensities of the laser beam detected by the first photo diode and the second photo diode are compared, so that a wavelength of the laser beam which is emitted from the laser diode chip is determined.

Advantageous Effects

As described above, the laser diode package structure according to the embodiment of the present invention has a very small volume and enables a laser module including the wavelength measuring device to be manufactured by using a very inexpensive TO type package, so that the volume and cost of the wavelength-tunable laser can be reduced.

MODE FOR INVENTION

Hereafter, embodiments of the present invention will be described in detail with reference to the accompanying drawings.

Figure 5:
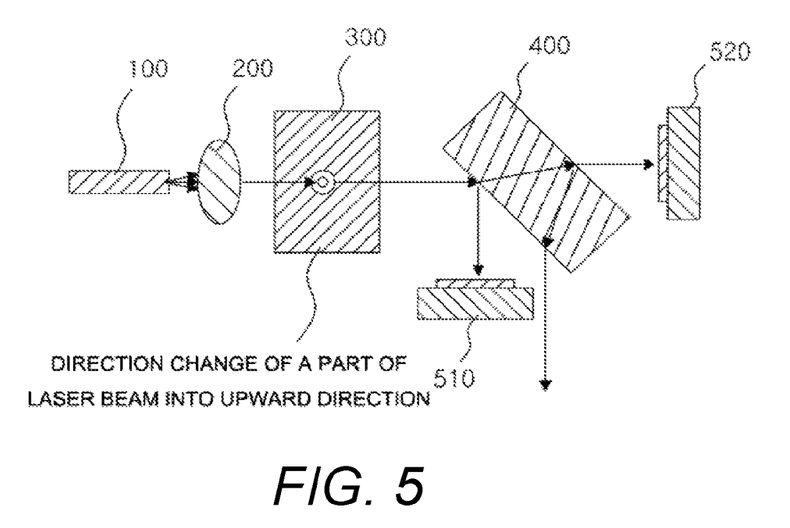
FIG. 5 is a top conceptual view of a TO can type package of a TO can type wavelength-tunable laser which has a wavelength monitoring function in accordance with an embodiment of the present invention.

FIG. 5 is a top view showing a TO can type laser diode package including a wavelength measuring device in a wavelength-tunable laser according to the embodiment of the present invention.

The wavelength-tunable laser shown in FIG. 5 does not operate itself as a laser package including a wavelength-tunable function. However, if a device capable of selecting a particular wavelength from laser beams emitted from the TO can type package and of returning it to the laser diode chip is added to the structure of FIG. 5, the structure operates as the wavelength-tunable laser, including the portion which selects the wavelength and returns it to the laser diode chip. Since the particular wavelength is selected outside the TO can type package and is returned to the laser diode chip within the TO can type package by existing various methods, a description thereof will be omitted.

Figure 6:
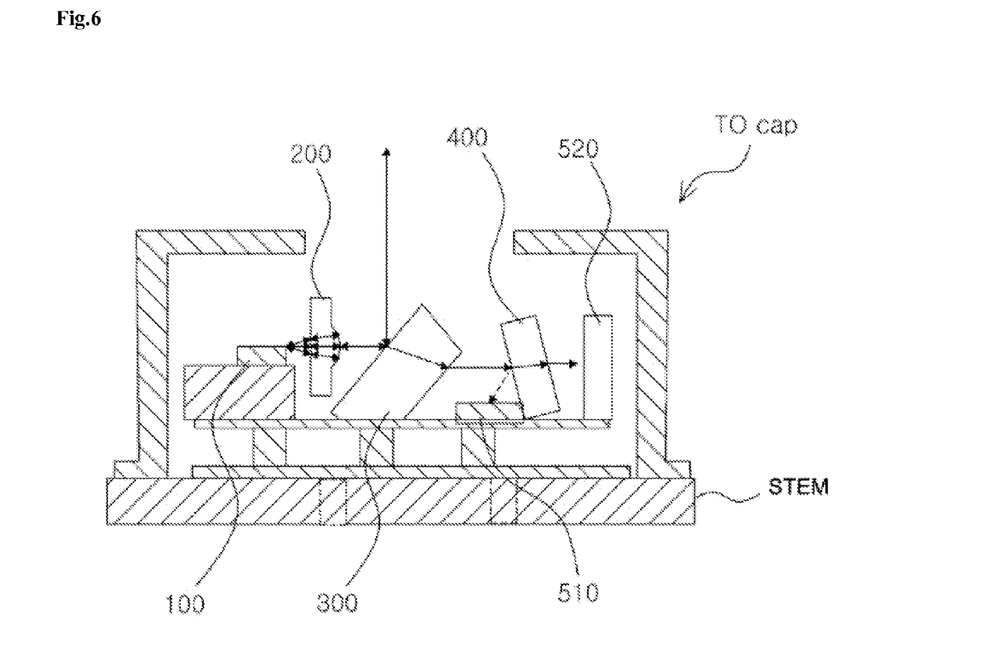
FIG. 6 is a side conceptual view of the TO can type package of the TO can type wavelength-tunable laser which has the wavelength monitoring function in accordance with the embodiment of the present invention.

Meanwhile, FIG. 6 is a side view showing the TO can type package of FIG. 5.

As shown in FIGS. 5 and 6, in the embodiment of the present invention, after the laser beam emitted from one side of a laser diode chip 100 is collimated by a collimating lens 200, the laser beam passes through a 45-degree reflection mirror 300 which reflects and emits a part of the beam to the outside of the TO can type package and allows a part of the laser beam to pass therethrough. The 45-degree reflection mirror 300 reflects a beam having a specific ratio predetermined regardless of the wavelength and emits the beam to the outside of the TO can type package. The beam having a predetermined specific ratio transmits through the 45-degree reflection mirror 300 and travels.

The beam which has transmitted through the 45-degree reflection mirror 300 is split into at least two branched beams by a wavelength selective filter 400.

Figure 7:
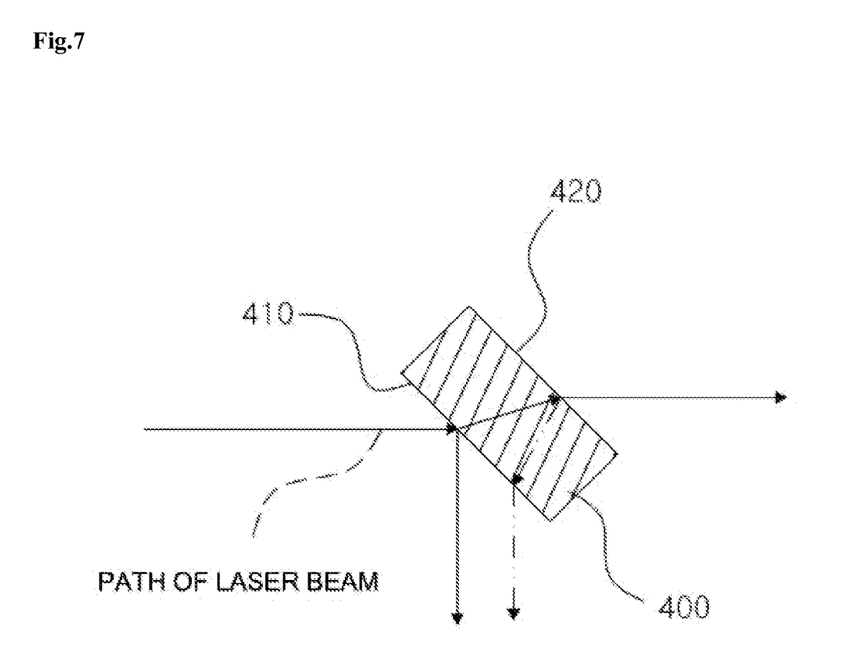
FIG. 7 shows an embodiment of a wavelength selective filter according to the embodiment of the present invention.

FIG. 7 shows a structure of the wavelength selective filter according to the embodiment of the present invention. The wavelength selective filter 400 according to the embodiment of the present invention is comprised of a reflective surface 410 and a substrate reflective surface 420. The reflective surface 410 is formed by stacking a dielectric thin film of which the transmittance/reflectance are not varied according to the wavelength on a transparent substrate for the laser beam (for example, glass, quartz, etc.). The substrate reflective surface 420 is formed by depositing the wavelength selective filter of which the transmittance/reflectance are varied according to the wavelength. Therefore, the beam which has reached the reflective surface 410 of the wavelength selective filter 400 is split into the transmission component and the reflection component.

Also, the beam transmitting through the reflective surface 410 transmits through the substrate reflective surface 420 in accordance with a transmission ratio determined depending on the wavelength at the substrate reflective surface 420, i.e., the other side of the wavelength selective filter 400, and travels to a second photo diode 520 for monitoring the beam intensity. The beam which reflects at the reflective surface 410, i.e., one side of the wavelength selective filter 400 reflects at a constant ratio irrespective of the wavelength, and then travels to a first photo diode 510 for monitoring the beam intensity.

Therefore, the ratio of the beam transmitting through the substrate reflective surface 420, i.e., one side of the wavelength selective filter 400 can be found by comparing the intensities of photo current flowing through the two photo diodes 520 and 510 of the TO can type package. This transmittance is compared with the transmittance according to the predetermined wavelength, so that the wavelength of the beam can be found.

Figure 8:
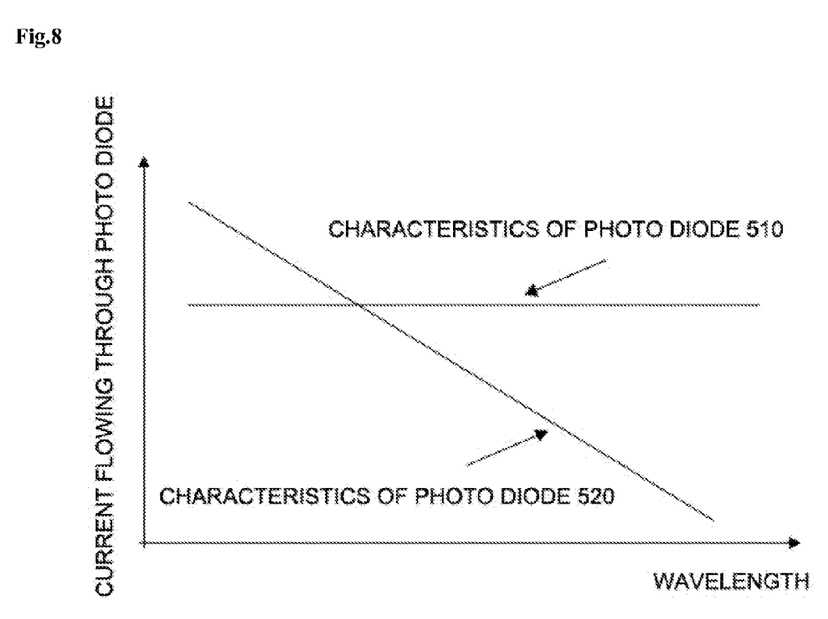
FIG. 8 shows an embodiment showing current flowing through two photo diodes in accordance with the wavelength in the structure of FIG. 6.

FIG. 8 is a graph showing that when the beam having a constant intensity is emitted from the laser diode chip, the intensities of the current flowing through the two photo diodes are compared in accordance with the wavelength of the beam.

As shown in the graph of FIG. 8, the intensity of the beam is found by using the current flowing through the first photo diode 510, and the transmittance of the beam is found by diving the current flowing through the second photo diode 520 by the current flowing through first photo diode 510. As a result, the wavelength of the laser beam can be found.

Therefore, through the embodiment of the present invention, it is possible to manufacture the wavelength-tunable laser having the wavelength monitoring function by using the TO can type package.

Figure 9:
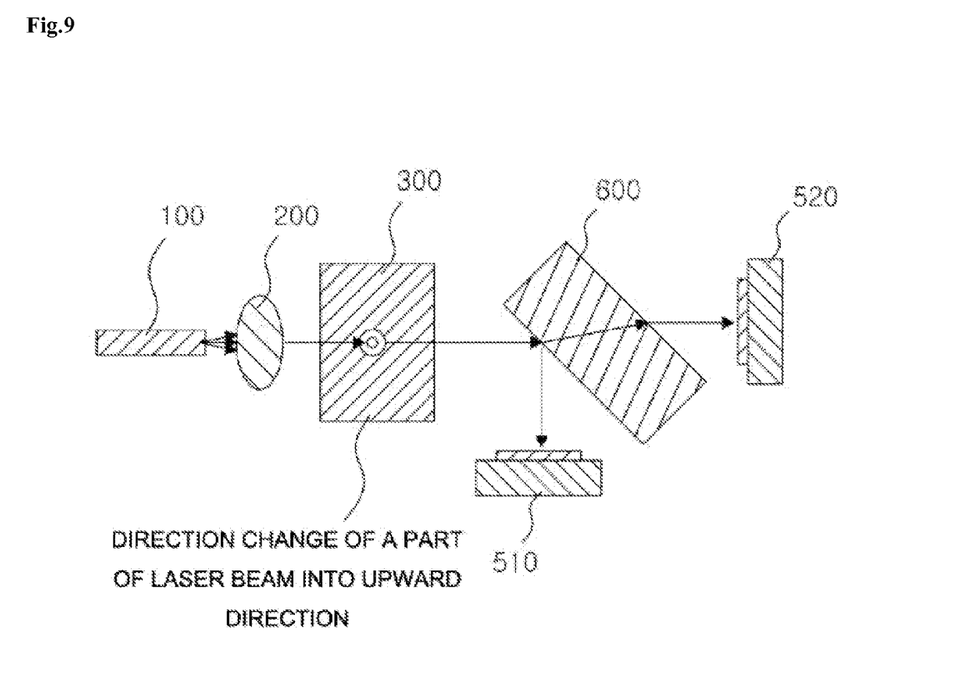
FIG. 9 is a top conceptual view of a TO can type package according to another embodiment of the present invention.

Meanwhile, the TO can type laser diode package including the wavelength measuring device in the wavelength-tunable laser according to the embodiment of the present invention may be implemented with various structures. FIG. 9 shows another embodiment of the present invention.

As shown in FIG. 9, another embodiment of the present invention shows the TO can type wavelength-tunable laser having the wavelength monitoring function when a wavelength selective filter of which the transmittance/reflectance are varied according to the wavelength is deposited on one side of a wavelength selective filter 600.

Figure 10:
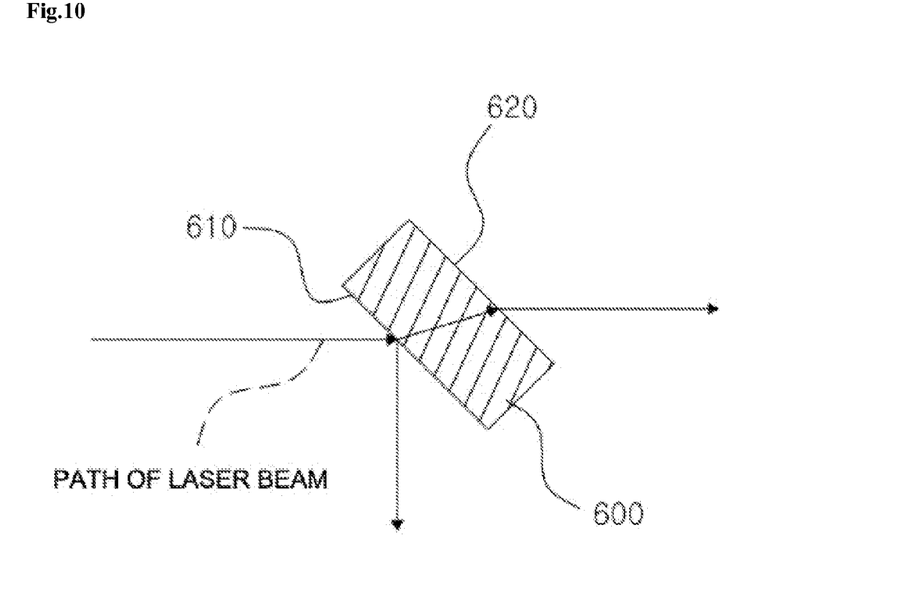
FIG. 10 shows an embodiment of a wavelength selective filter which is used in the structure of FIGS. 9.

FIG. 10 shows a detailed structure of the wavelength selective filter shown in FIG. 9. As shown in FIG. 10, a thin film of which the transmittance/reflectance are varied according to the wavelength is deposited on a reflective surface 610, i.e., one side of the wavelength selective filter 600 according to another embodiment of the present invention. It is preferable that the other side 620 of the wavelength selective filter 600 is anti-reflectively coated.

In FIGS. 9 and 10, the transmittance/reflectance of the reflective surface 610, i.e., one side of the wavelength selective filter 600 are varied according to the wavelength of the laser beam. Here, FIG. 11 is a graph showing that currents flowing through the two photo diodes 510 and 520 are compared.

Figure 11:
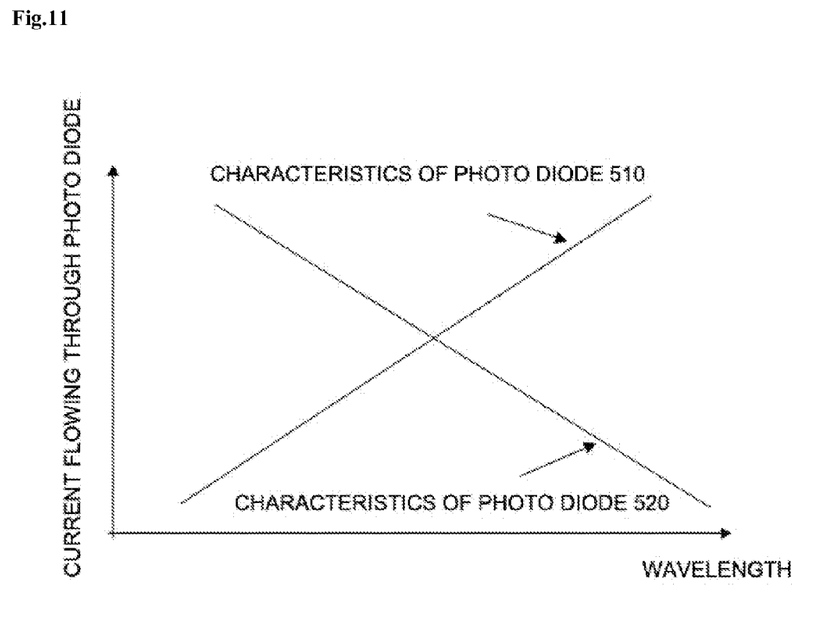
FIG. 11 shows an embodiment showing current flowing through two photo diodes in accordance with the wavelength in the structure of FIG. 9.

As shown in FIG. 11, since the sum of the currents flowing through the two photo diodes 510 and 520 is proportional to the intensity of the laser beam which is emitted from the laser diode chip 100, it is possible to obtain the wavelength of the laser beam through the ratio of the currents flowing through the two photo diodes 510 and 520.

As such, through the embodiment of the present invention, the intensity of the beam which is reflected by the wavelength selective filter of which the transmittance is varied according to the wavelength of the input laser beam and the intensity of the beam which transmits through the wavelength selective filter are detected and compared with each other by the photo diode, so that the wavelength of the laser beam can be determined.

The present invention is not limited to the above-described embodiments and may be variously changed and modified without departing from the spirit of the present invention, the appended claims and equivalents thereto by those skilled in the art.

What is claimed is:

1. A wavelength-tunable laser apparatus which is a TO-can type wavelength-tunable laser apparatus comprising
a laser diode chip (100) for emitting a laser beam,
a collimator lens (200) for collimating the laser beam,
a wavelength-selective filter (400 or 600) through which a selected wavelength passes, and
a reflecting mirror (300) having a 45-degree inclined reflective surface,
wherein the laser beam is emitted from the laser diode chip (100), collimated by the collimator lens (200) and is split into a first beam and a second beam by the reflecting mirror (300), wherein the first beam is emitted to the outside of a TO-can type package, and wherein the second beam passes through the reflecting mirror (300), and subsequently reaches the wavelength-selective filter (400 or 600), and is split into a third branched beam and a fourth branched beam, wherein the third branched beam is reflected by the wavelength-selective filter (400 or 600), and wherein the fourth branched beam transmits through the wavelength-selective filter (400 or 600);

wherein a first photodiode (510) is arranged on the path of the third branched beam so as to monitor the third branched beam, and wherein a second photodiode (520) is further arranged on the path of the fourth branched beam, so as to monitor the fourth branched beam; and wherein the laser beam wavelength is determined through a ratio of currents flowing through the first photodiode and the second photodiode; and wherein the wavelength-selective filter (400) comprises a reflective surface (410) and a substrate reflective surface (420), wherein the reflective surface (410) comprises a dielectric thin film whose transmittance/reflectance is not varied according to the wavelength and wherein the dielectric thin film is stacked on one side of a substrate, on which the laser beam is incident, and wherein the substrate reflective surface (420) comprises the wavelength-selective filter (400) whose transmittance/reflectance is varied according to the wavelength and wherein the wavelength-selective filter (400) is deposited on an other side of the substrate.

\* \* \* \* \*